United States Patent
Jeter et al.

(10) Patent No.: US 10,408,863 B2
(45) Date of Patent: Sep. 10, 2019

(54) REFERENCE VOLTAGE PREDICTION IN MEMORY SUBSYSTEM

(71) Applicant: Apple Inc., Cupertino, CA (US)

(72) Inventors: Robert E. Jeter, Santa Clara, CA (US); Fabien S. Faure, Santa Clara, CA (US); Rakesh L. Notani, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/848,804

(22) Filed: Dec. 20, 2017

(65) Prior Publication Data

US 2019/0187189 A1 Jun. 20, 2019

(51) Int. Cl.
| | |
|---|---|
| *G11C 7/10* | (2006.01) |
| *G01R 19/165* | (2006.01) |
| *G11C 5/14* | (2006.01) |
| *G11C 8/12* | (2006.01) |
| *G11C 5/02* | (2006.01) |

(52) U.S. Cl.
CPC .......... *G01R 19/16566* (2013.01); *G11C 5/02* (2013.01); *G11C 5/147* (2013.01); *G11C 7/1066* (2013.01); *G11C 8/12* (2013.01); *G11C 2207/2254* (2013.01)

(58) Field of Classification Search
CPC .................................. G11C 7/12; G11C 8/08
USPC ............................................ 365/189.09, 226
See application file for complete search history.

(56) References Cited

U.S. PATENT DOCUMENTS

| | | | | |
|---|---|---|---|---|
| 7,872,494 | B2* | 1/2011 | Welker | H03K 5/1565 |
| | | | | 326/30 |
| 8,456,928 | B2 | 6/2013 | Mutnury | |
| 8,923,442 | B2* | 12/2014 | Chandrasekaran | ... H04L 25/063 |
| | | | | 375/224 |
| 9,286,961 | B1* | 3/2016 | Jeter | H03L 7/08 |
| 9,436,387 | B2* | 9/2016 | Jeter | G06F 3/0604 |
| 9,672,882 | B1 | 6/2017 | Jeter | |
| 9,691,470 | B1 | 6/2017 | Jeter | |
| 10,083,736 | B1* | 9/2018 | Jeter | G11C 11/4076 |
| 2012/0311402 | A1* | 12/2012 | Tseng | G06F 11/1048 |
| | | | | 714/763 |
| 2013/0293260 | A1 | 11/2013 | Shiah | |
| 2014/0035771 | A1* | 2/2014 | Tsai | H03M 1/12 |
| | | | | 341/172 |

(Continued)

*Primary Examiner* — Michael T Tran
(74) *Attorney, Agent, or Firm* — Meyertons, Hood, Kivlin, Kowert & Goetzel, P.C.; Erik A. Heter (57) ABSTRACT

A method and apparatus for predicting a reference voltage in a memory subsystem is disclosed. A memory subsystem includes a memory controller coupled to a memory. The memory controller includes a lookup table having a number of different reference voltage values each corresponding to one of a number of different performance states. The memory controller further includes calibration circuitry configured to determine reference voltages for operation in various performance states. Responsive to returning to a performance state after operating in another, the calibration circuitry may restore the reference voltage to its most recently used value, and also obtain a predicted reference voltage. Calibrations may be performed at both the restored reference voltage and the predicted reference voltage obtained from the lookup table. The subsequent operating reference voltage may then be selected based on which of the two calibrations resulted in the largest data eye width.

18 Claims, 6 Drawing Sheets

(56) References Cited

U.S. PATENT DOCUMENTS

| | | | |
|---|---|---|---|
| 2015/0074381 A1* | 3/2015 | Bose | G06F 9/3867 |
| | | | 712/220 |
| 2015/0095741 A1* | 4/2015 | Lin | G06F 11/1008 |
| | | | 714/773 |
| 2015/0178156 A1* | 6/2015 | Shin | G06F 11/1072 |
| | | | 714/721 |
| 2015/0280748 A1* | 10/2015 | Gendler | G06F 11/1008 |
| | | | 714/755 |
| 2015/0331748 A1* | 11/2015 | Cohen | G06F 11/1012 |
| | | | 714/764 |
| 2015/0378808 A1* | 12/2015 | Kumar | G09C 1/00 |
| | | | 714/799 |
| 2016/0035411 A1* | 2/2016 | Yu | G11C 11/4091 |
| | | | 365/189.07 |
| 2016/0204750 A1* | 7/2016 | Kawasaki | H03F 1/3252 |
| | | | 330/295 |
| 2016/0313941 A1* | 10/2016 | Suzuki | G06F 3/0625 |
| 2018/0004419 A1* | 1/2018 | Thakur | G06F 11/1068 |
| 2018/0052615 A1* | 2/2018 | Russell | G06F 11/1072 |
| 2018/0062666 A1* | 3/2018 | Zhang | H03M 13/114 |
| 2018/0173587 A1* | 6/2018 | Chaiken | G06F 11/10 |
| 2018/0188160 A1* | 7/2018 | Matsui | G01N 21/27 |

* cited by examiner

| Index | F1 Vref | F0 Vref Prediction |
|---|---|---|
| 0 | 30 | 43 |
| 1 | 32 | 45 |
| 2 | 34 | 46 |
| 3 | 36 | 49 |
| 4 | 38 | 52 |
| 5 | 40 | 55 |
| 6 | 42 | 58 |
| 7 | 44 | 60 |

REFERENCE VOLTAGE PREDICTION IN MEMORY SUBSYSTEM

BACKGROUND

Technical Field

This disclosure is directed to memory subsystems, and more particularly, calibration of signals conveyed in memory subsystems.

Description of the Related Art

Eye patterns, or eye diagrams, are graphic illustrations that illustrate times and amplitudes at which a digital signal can be sampled at its correct value. In various types of systems that include data transmissions, sampling of signals (based on a clock signal) near a center of an eye, in terms of time, may be desirable. This may provide a signal with a sufficient amount of both setup and hold time, while also rendering it less susceptible to noise. In sampling a signal, a threshold voltage is used to determine whether the signal is interpreted as a logic 0 or a logic 1.

In memory systems, calibrations may be performed to determine the points at which signals are sampled within the eye pattern. Calibrations may be performed to determine both the point in time at which signals are sampled, as well as to determine the threshold voltage for distinguishing between logic 0's and logic 1's. Performing these calibrations typically includes adjusting a number of different parameters that govern transmission of data between a memory controller and a memory. Such calibrations may be performed on a periodic basis. Additionally, since some systems have multiple operating points (e.g., combinations of clock frequency and supply voltage), calibrations may also be performed upon a switch from one operating point to another.

SUMMARY

A method and apparatus for predicting a reference voltage in a memory subsystem is disclosed. In one embodiment, a memory subsystem includes a memory controller coupled to a memory. The memory controller includes a lookup table having a number of different reference voltage values each corresponding to one of a number of different performance states. The memory controller further includes calibration circuitry configured to determine reference voltages for operation in various performance states. Responsive to returning to a performance state after operating in another, the calibration circuitry may restore the reference voltage to its most recently used value, and also obtain a predicted reference voltage. Calibrations may be performed at both the restored reference voltage and the predicted reference voltage obtained from the lookup table. The subsequent operating reference voltage may then be selected based on which of the two calibrations resulted in the largest data eye width.

The reference voltages referred to above are those voltages which are used to distinguish between a logic one and a logic zero during reads of data from memory. The calibrations referred to above may include calibration of a data strobe signal conveyed between the memory controller and the memory during read operations.

In one embodiment, if the restored reference voltage and the predicted reference voltage differ by less than a threshold, at least one of the calibrations may be canceled. In instances when both calibrations are performed and the selected operating reference voltage is based on the restored reference voltage, the lookup table may be updated with the restored reference voltage becoming the predicted reference voltage for that particular performance state. A performance state as defined herein may include a particular operating clock frequency, and may also include an operating supply voltage. Thus, changing the performance state may be defined as changing at least one of the operating clock frequency and operating supply voltage.

BRIEF DESCRIPTION OF THE DRAWINGS

The following detailed description makes reference to the accompanying drawings, which are now briefly described.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

Figure 1:
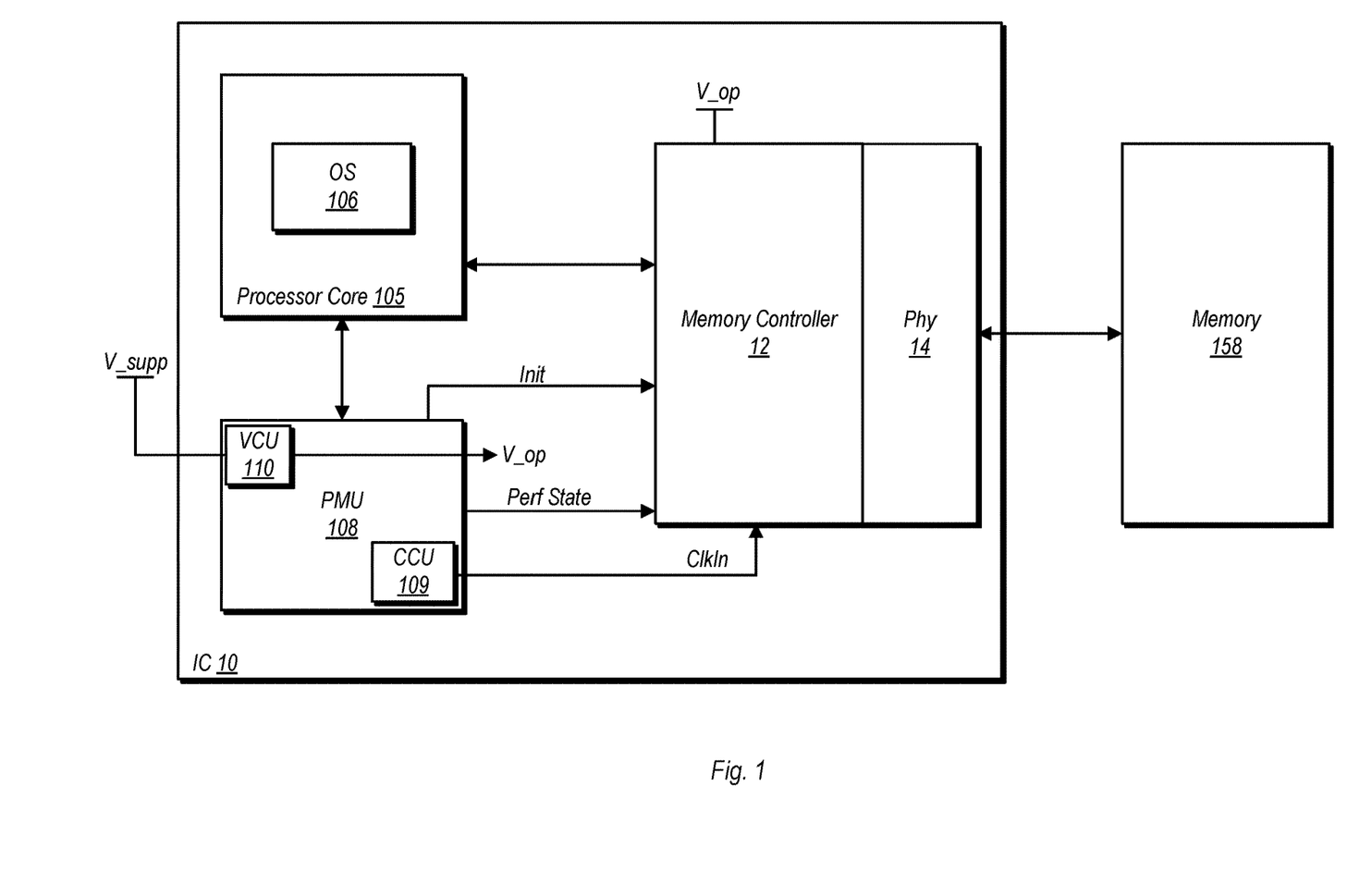
FIG. 1 is a block diagram of one embodiment of an integrated circuit and a memory coupled thereto.

FIG. 1 is a block diagram of one embodiment of an integrated circuit (IC). IC 10 is shown here as a simplified block diagram including various units/circuits implemented thereon. However, other embodiments are possible and contemplated, and may include additional circuits/units not shown here or explicitly discussed herein.

In the embodiment shown, IC 10 is coupled to a memory 158. In one embodiment, memory 158 is a dynamic random access memory (DRAM), although the scope of this disclosure is not limited to DRAM.

IC 10 in the embodiment shown includes at least one processor core 105, although multiple instances of the same may be present. Processor core 105 is configured to execute software instructions, including those of operating system (OS) 105. The instructions of OS 105 may, when executed, cause various system management functions to be performed, such as memory allocation, performance state changes, and so forth.

IC 10 also includes a power management unit (PMU) 108 in the illustrated embodiment. PMU 108 may implement circuitry that performs various power control functions, such as operating voltage changes, power gating, clock frequency changes, and clock gating. These power control functions may be performed in conjunction with performance state changes. Such performance state changes may be put into effect via execution of instructions of OS 105 or through other mechanisms within PMU 108 itself. A performance state (which may also be referred to herein as an operating point) may be defined as combination of an operating voltage and clock frequency. These parameters may be adjusted for desired performance and power savings. For example, if high performance is desired at a given time during operation, the clock frequency and/or the operating voltage may be increased. If reducing power consumption is prioritized at a given time during operation, the clock frequency and/or supply voltage may be reduced. In general, PMU 108 may adjust the clock frequency and operating voltage may be adjusted during operation in an attempt to optimize the amount of performance achieved per watt of power consumed.

PMU 108 in the illustrated embodiment includes a clock control unit (CCU) 109. A clock signal, ClkIn, may be provide from CCU 109 to a memory controller 12 of IC 10. This clock signal may be generated internal to CCU 109, or by clock generation circuitry external thereto.

PMU 108 in the embodiment shown also includes a voltage control unit (VCU) 110. An external supply voltage, V_supp, is provided to VCU 110. Circuitry within VCU 110 may adjust the voltage output therefrom, V_op, which is the operating voltage supplied to memory controller 12, among other places. PMU 108 may accomplish performance state changes by adjusting the frequency of the clock output from CCU 109, changing the operating voltage, or both.

Memory controller 12, which includes physical interface (PHY) 14, provides an interface between processor core 105 and memory 158. Although not explicitly shown, IC 10 may also include one or more units of interface circuitry that are also coupled to memory controller 12. Accordingly, memory controller 12 may provide an interface for one or more circuits external to IC 10 and memory 158.

During operation, memory controller 12 may operate in a number of different performance states. The different performance states may in turn utilize different frequencies for ClkIn with respect to one another, and different operating voltages as well. In some embodiments, the decision to change the performance state may be made by OS 106. In other embodiments, the decision may be made by PMU 108. In either case, PMU 108 may provide an indication ('Perf State') that a performance state change is pending. Upon returning to a performance state in which the memory subsystem previously operated, a most recently used reference voltage may again be used in determining whether data bits read from memory are logic 1's or logic 0's. However, it is possible that some operating conditions may have changed (e.g., process, voltage, temperature) since the previous period of operation in that performance state. Accordingly, reference voltage calibrations may be performed upon returning to a given performance state. As is discussed below, circuitry one embodiment of a memory subsystem may perform calibrations at both a previously used (and restored) value of the reference voltage, as well as at a predicted reference voltage.

Figure 2:
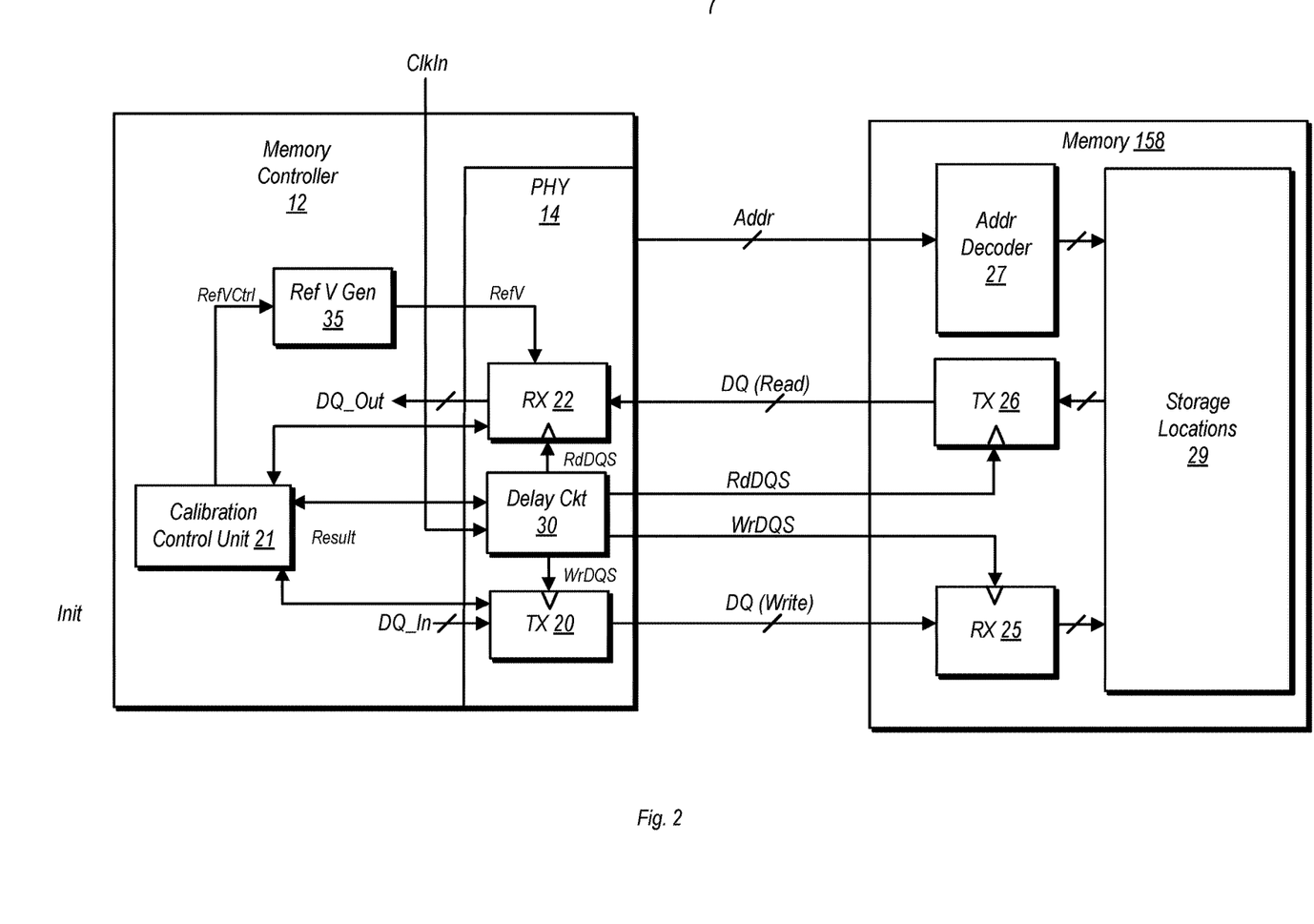
FIG. 2 is a block diagram of one embodiment of a memory subsystem.

Turning now to FIG. 2, a block diagram of a system having a memory controller and a memory is shown. In the embodiment shown, system 5 includes a memory controller 12 and a memory 158. The memory controller 12 includes a physical layer 14 which is used for interfacing with memory 158. The physical layer 14 includes a receiver 22 configured to receive data read from memory 158, and a transmitter 20 configured to transmit data to memory 158. Memory 158 includes an address decoder 27, a number of storage locations 29, a receiver 25 configured to receive data to be written and a transmitter 26 configured to transmit data that has been read. Although not explicitly shown, memory 158 may include additional logic for receiving read and write enable signals, with such logic being configured to enable selected storage locations for read and write operations, respectively. Additionally, memory controller 12 in the embodiment shown includes calibration control unit 21, which includes circuitry for performing various functions, including conducting calibrations for both the data strobe signals as well as for the reference voltage.

Physical layer 14 includes a delay circuit 30 that is coupled to receive an input clock signal ('Clk'). In the embodiment shown, delay circuit 30 may include two separate paths to apply delays to the input clock signal to generate a read data strobe ('RdDQS') and a write data strobe ('WrDQS'). For example, one embodiment of delay circuit 30 may include a pair of delay locked loops (DLLs), one configured to output the read data strobe and one to output the write data strobe. The delays of the respective DLL's may be set according to control signals generated elsewhere in memory controller 12, e.g., in calibration control unit 21. Types of delay circuits other than DLL's are also possible and contemplated for various other embodiments.

Delay circuit 30 may provide the read data strobe to receiver 22 in physical layer 14, as well as to transmitter 26 in memory 158. The read data strobe signal may be used in synchronizing reads of memory 158. The write data strobe may be provided to transmitter 20 of physical layer 14, along with receiver 25 of memory 158. Accordingly, the write data strobe may be used in synchronizing writes to memory 158.

Memory 158 in the embodiment shown includes an address decoder 27 coupled to receive an address from physical layer 14 of memory controller 12. Address decoder 27 may decode the received address to enable particular ones of the storage locations 29 that are to be enabled for a current memory operation. Addresses may be provided from physical layer 14 of memory controller 12 for both read operation and write operations.

The data strobe signals provided by delay circuit 30 may be subject to inherent delays, particularly on the side of memory 158. Since the clock edges of the data strobe signals are used to validate data received from memory controller 12 when received by receiver 25 at memory 158, as well as to validate data transmitted from transmitter 26 of memory 158, it is important that setup and hold time requirements for both are observed. Moreover, the data strobe signals used herein are used to synchronize the sampling of multiple bits. Furthermore, the signal paths for conveying bits between memory controller 12 and memory 158 may each be subject to their own unique delays, and thus some inter-lane skew may be present among the data bits. It is desirable that each data signal be sampled at or near the center of a window that may be depicted by an eye diagram. Accordingly, procedures to calibrate the data strobe signals to compensate for inherent delays may be performed at certain times during operation of memory controller 12 in order to optimize the point in time at which the data strobe signals sample data. The calibration procedures may be conducted under the control of calibration control unit 21, and involved performing a number of reads of from memory along with adjustments of an amount of delay applied to the data strobe signal being calibrated. The calibration of the data strobe delay may be performed periodically, and may sometimes be referred to as a horizontal calibration.

A reference voltage calibration may also be performed under the control of calibration control unit 21. The reference voltage may be that voltage that is used to distinguish between a logic 0 and a logic 1. Over time, due to process, voltage, and temperature variations, the reference voltage may need to be calibrated. This calibration may also be performed periodically, and may sometimes be referred to as a vertical calibration. Performing a vertical calibration may include performing a number of horizontal calibrations at different reference voltage values. Based on the calibration, calibration control unit 21 may set the reference voltage at reference voltage generator 35 using the signal RefVCtrl. The reference voltage, RefV, or an indication of the same, may be provided from reference voltage generator 35 to receiver 22.

In various embodiments discussed below, the calibrations of the reference voltage may be performed upon changing performance states. These calibrations may be horizontal calibrations (e.g., calibrations of a data strobe signal) at a particular reference voltage. If the system has previously operated in a given performance state, upon return thereto, the most recently used reference voltage may be restored, and a calibration may be conducted at the restored reference voltage. Additionally, a predicted reference voltage value may be obtained from a lookup table, and a calibration may also be conducted at the predicted value if the difference between the predicted value and restored value differ by at least a threshold value. Upon completing the calibrations, calibration circuitry may set the operational reference voltage to the value (restored or predicted) which, upon performing the calibrations, yielded the largest data eye. In the case in which the restored voltage is selected as the operational reference voltage value, the lookup table may be updated to overwrite the predicted value with the restored value.

In the case in which the restored and predicted reference voltage values differ by less than a predetermined threshold value, at least one of the calibrations may be canceled, if not both. In one embodiment, when the restored and predicted reference voltage values differ by less than a threshold, a calibration may be performed at the restored value (e.g., to ensure that the eye diagram is of sufficient width), while the calibration at the predicted value may be canceled. If the data eye width is determined to be sufficient, the system may, at least for a time, forego further calibrations in that performance state. Alternatively, some embodiments may forgo further calibrations, at least for a time, if the restored and predicted reference voltage values differ by less than the threshold. Various embodiment of such system will now be discussed in further detail below.

Figure 3:
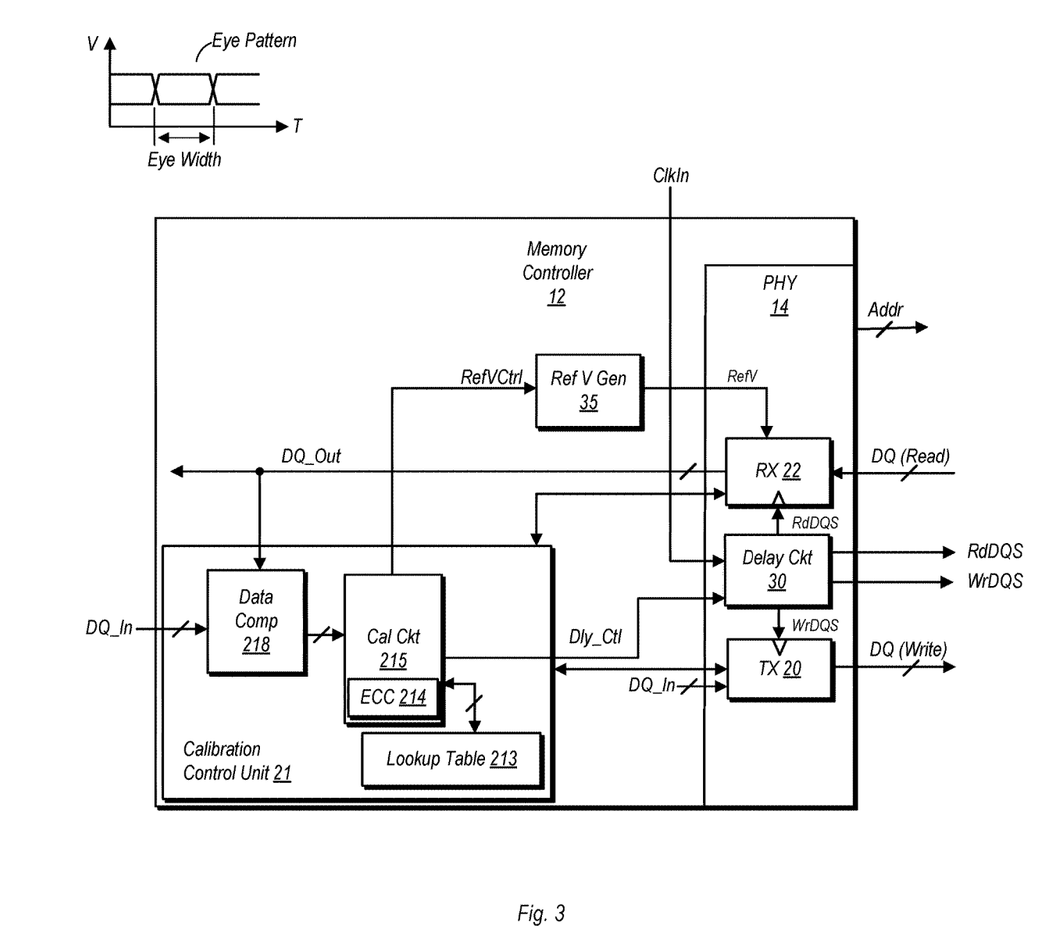
FIG. 3 is a block diagram of one embodiment of a memory controller.

Turning now to FIG. 3, a block diagram of one embodiment of a memory controller is shown. Memory controller 12 in the illustrated embodiment includes calibration control unit 21, which implements circuitry for performing various calibration functions. Included in calibration control unit 21 is calibration circuit 215, which carries out calibration of the various data strobe signals (write and read data strobes) as well as calibrations of the reference voltage used to distinguish between logic 1's and logic 0's as read from the memory. Calibration control unit 21 also includes data comparator 218, which includes circuitry for performing data comparisons, and lookup table 213 for storing predicted reference voltage values. Various types of memory (e.g., static, non-volatile, etc.) may be used to store predicted reference voltage values in lookup table 213. For each performance state in which the system is capable of operating, lookup table 213 may store a corresponding predicted reference voltage.

In performing calibrations, comparisons of data may be performed by data comparator 218. In the illustrated embodiment, calibrations may include writing data to an address in memory and then reading back data from the same address, and comparing the two. However, embodiments are possible and contemplated in which comparisons are conducted in a different manner, e.g., where known data is read from designated addresses and compared to expected values. Each comparison of data may include a bit-by-bit comparison of data. These bit-by-bit comparison results may be conveyed to calibration circuit 215, which may use the results in determining delay and reference voltage settings.

As noted above, a lookup table is utilized for predicting a reference voltage for use in each of a number of different performance states. The predicted reference voltage may be that which is deemed the most suitable (e.g., largest data eye width) for that particular performance state. The lookup table may initially be populated with data provided by a vendor of the memory, although other mechanisms for determining this data are possible and contemplated. During an initial system boot, the lookup table may be loaded with the data from a source external to memory controller 12.

In one embodiment, full calibrations of the data strobe signals and reference voltage may be conducted upon operating in a particular performance state for the first time. Upon subsequently re-entering a given performance state (after operating in at least one different performance state), limited calibrations may be conducted at two different reference voltages. The first of these reference voltages is the restored value, i.e. that which was used during the previous instance of operating in that same performance state. The other reference voltage is a predicted value obtained from the lookup table. The respective calibrations conducted at these two reference voltage values may be horizontal calibrations, e.g., calibrating the read data strobe signal. Calibration circuit 215 may determine which of the two calibrations resulted in the largest data eye width, and select that value as the operational reference voltage for subsequent operation in that performance state. Thereafter, calibration circuit 215 may set the reference voltage output by reference voltage generator 35 to the selected value, via the RefVCtrl signal(s).

Prior to performing the calibrations noted above, calibration circuit 215 may determine a difference between the restored reference voltage and the predicted reference voltage. If the difference is negligible (e.g., less than a threshold value), calibration circuit may cancel at least one of the calibrations, such as the calibration at the predicted reference voltage value. In one embodiment, no calibration is performed, and the system may operate using the restored reference voltage. In another embodiment, a calibration at the restored value may still be performed, e.g., in order to ensure that the width of the data eye meets at least some minimum acceptable value. In such embodiments, if the eye width is found to be too narrow, a full reference voltage calibration may be performed to find a suitable value. Upon completing such a calibration, the predicted reference voltage for the particular performance state may be overwritten by the new value.

In instances in which calibrations are performed for both the predicted value and the restored value, the lookup table 213 may be updated based on the calibration results. In particular, when the restored value is selected as the operating reference voltage, the lookup table may be updated to overwrite the previous predicted value with the current restored value. Furthermore, after the first full reference voltage calibration is performed after a performance state change, the corresponding predicted reference voltage stored in lookup table 213 may also be updated with the calibrated value.

In the illustrated embodiment, calibration circuit 215 includes error correction circuitry (ECC) 214 to check for errors in data read from lookup table 213. If an error is detected in a predicted reference voltage obtained from lookup table 213, and the error is correctable, ECC 214 may correct the predicted value for use by calibration circuit 215. If a detected error is not correctable, calibration circuit 215 may perform other corrective actions, such as additional calibrations to arrive at a suitable operating value for the reference voltage. The additional calibrations may include calibrations at not only the restored value of the reference voltage, but at additional reference voltage values. In some embodiments, calibration circuit 215 may (at least in some instances) also simply select the restored reference voltage value and perform a horizontal calibration to ensure that the data eye has sufficient width.

Figure 4:
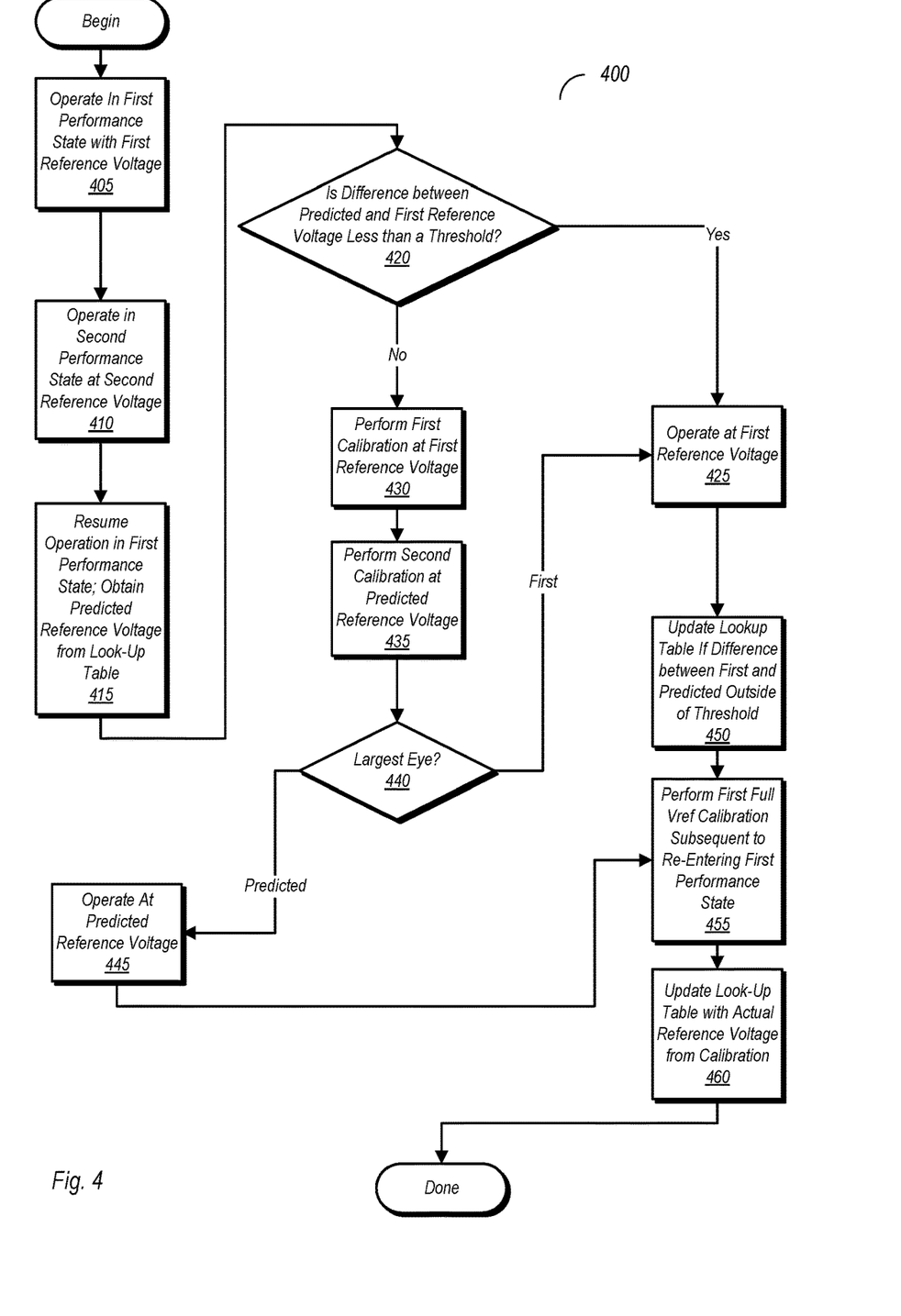
FIG. 4 is a flow diagram of one embodiment of determining a reference voltage based on previously used and predicted values.

FIG. 4 is a flow diagram of one embodiment of determining a reference voltage based on previously used and predicted values. Method 400 may be performed with various embodiments of the apparatus discussed above. Furthermore, other apparatus embodiments capable of performing method 400 are also possible and contemplated, and may thus fall within the scope of this disclosure.

Method 400 begins with operation in a first performance state with a first reference voltage value (block 400). After operating in the first performance state for some time, operation may switch to a second performance state with a second reference voltage (block 410). The second reference voltage may be different from the first, although this is not necessarily a requirement.

Subsequent to operation in the second performance state (if not additional performance states), operation may return to the first performance state. Upon returning to the first performance state, a predicted reference voltage value is obtained from a lookup table (block 415). The reference voltage may also be set to the first reference voltage value, which is restored value upon re-entry into the first performance state. A difference between the first reference voltage and the predicted reference voltage is then calculated. If the difference is less than a threshold value (block 420, yes), then operation proceeds with the first reference voltage value (block 425).

If the difference between the first reference voltage is greater than the threshold (block 420, no), a first calibration is performed at the first reference voltage (block 430) and a second calibration is performed at the predicted reference voltage (block 435). A subsequent operating reference voltage may then be selected based on which calibration result yielded the largest data eye width. If the results of the calibration conducted at the predicted reference voltage yielded the largest eye (block 440, predicted), then operation proceeds using the predicted reference voltage as the operating reference voltage (block 445). If the results of the calibration conducted as the first reference voltage yielded the largest eye (block 440, first), then operation proceeds using the first reference voltage as the operating reference voltage (block 425). Additionally, since the difference between the first reference voltage and the predicted reference voltage was outside (or greater than) the threshold value, the lookup table is updated to overwrite the predicted reference voltage value for the first performance state with the first reference voltage (block 450). At some point after re-entering the first performance state, a full reference voltage calibration may be performed (block 455), and the look-up table may be updated again with the actual reference voltage obtained from the full calibration (block 460).

Figure 5:
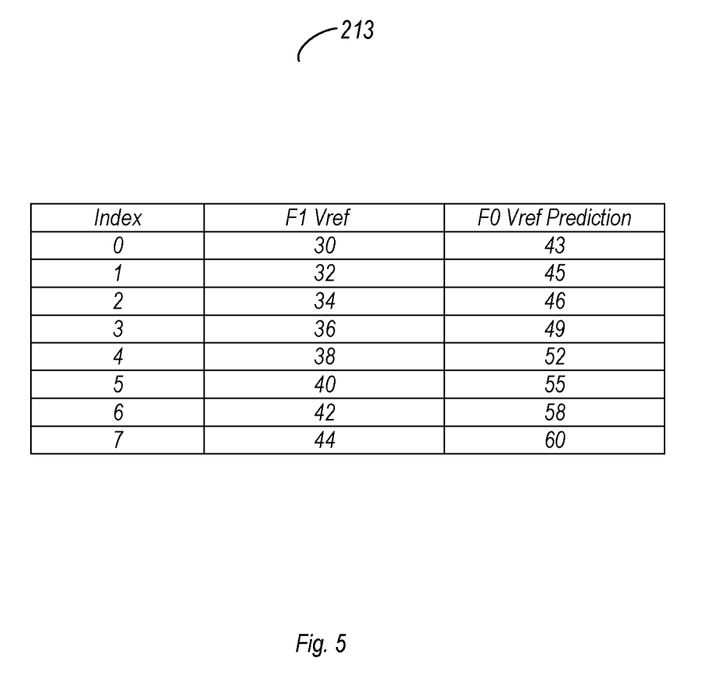
FIG. 5 is an illustration of one embodiment of an exemplary look-up table used for obtaining a reference voltage prediction.

FIG. 5 is a diagram of one embodiment of a lookup table used for reference voltage predictions in accordance with the methodology discussed above. It is noted that lookup table 213 as shown herein is exemplary, and is not intended to be limiting in any way. Furthermore, the specific numbers used here, as well as the number of and labels assigned to the performance states, are used here for the sake of illustration, but are not intended to be limiting to a specific embodiment, specific reference voltage values, ore a particular number of performance states. Generally speaking, the lookup table 213 shown here may be expanded or altered in a number of different ways will still falling within the scope of this disclosure.

In the embodiment shown, lookup table 213 includes three columns: Index, F1 VREF (a reference voltage for performance state F1) and F0 VREF prediction (a predicted reference voltage for performance state F0). The index value may refer to, for example, particular operating conditions (e.g., voltage and temperature conditions). Using the table, based on a particular index and a particular reference voltage used in performance state F1, a reference voltage prediction may be obtained for a transition to operation in performance state F0. For example, when conducting a performance state change from F1 to F0, with the index being 4, F1's current reference voltage value of 38 is used to predict a reference voltage of 52 in F0. Upon a transition into F0 under these conditions, a horizontal calibration is performed at F0's predicted reference voltage, as obtained from lookup table 213, with another horizontal calibration being performed at the restored reference voltage value of F0. Based on the results which yield the largest data eye width, either the predicted or the restored reference voltage value is selected as the operating reference voltage until at least the time another calibration is performed (e.g., a full reference voltage calibration including vertical and horizontal calibrations). Upon performing a full calibration, lookup table 213 may be updated with the resulting actual reference voltage obtained therefrom.

Figure 6:
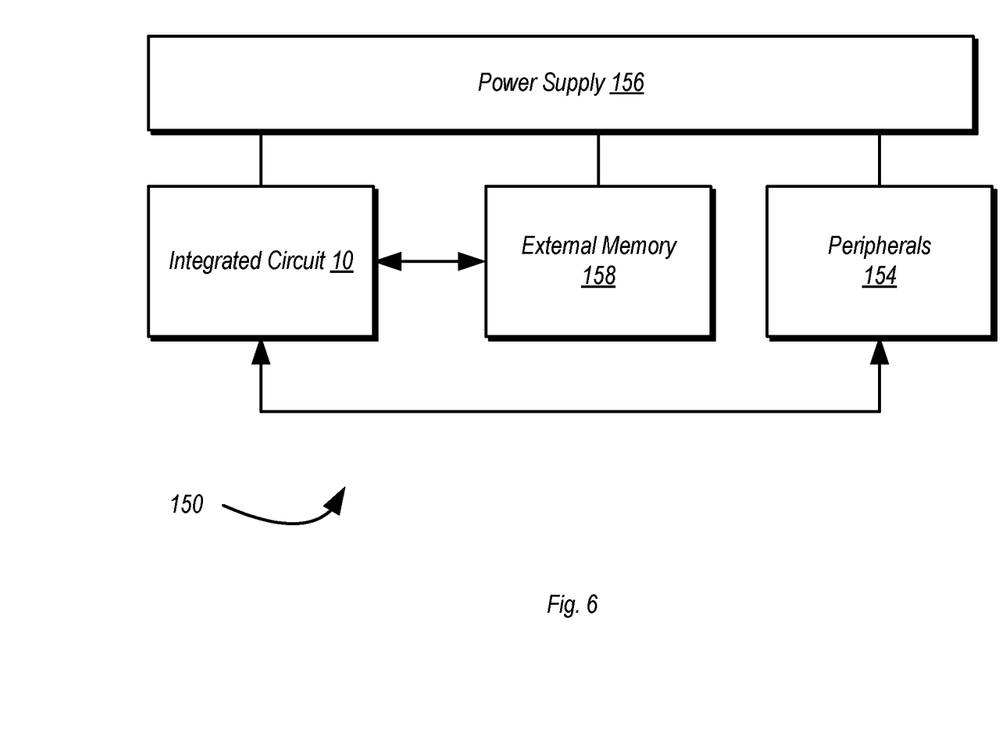
FIG. 6 is a block diagram of one embodiment of an exemplary system.

Turning next to FIG. 6, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAIVIBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An apparatus comprising:
 a memory subsystem including a memory and a memory controller coupled to the memory, wherein the memory controller is configured to convey a data strobe signal to the memory during transfers of data to and from the memory, wherein the memory controller includes lookup table comprising a plurality of different reference voltage values, each of the reference voltage values corresponding to a unique one of a plurality of different performance states; and
 error correction circuitry configured to check for errors in the lookup table by applying error correction codes (ECCs) to information read from the lookup table;
 wherein the memory controller includes calibration circuitry configured to:
  determine first and second reference voltages for use during operation of the memory subsystem in first and second performance states, respectively; and
  upon resuming operation in the first performance state, obtain a predicted reference voltage value from the lookup table and set an operating reference voltage to one of the first reference voltage and the predicted reference voltage based on calibration results.

2. The apparatus as recited in claim 1, wherein, upon resuming operation in the first performance state, the calibration circuit is configured to:
 perform a first calibration of the memory subsystem at the first reference voltage;

perform a second calibration of the memory subsystem at the predicted reference voltage; and select one of the first reference voltage and the predicted reference voltage as an operating voltage in the first performance state based on which of the first and second calibrations resulted in a largest data eye width.

3. The apparatus as recited in claim 2, wherein, upon resuming operation in the first performance state, the calibration circuit is configured to cancel the second calibration responsive to determining that a difference between the first reference voltage and the predicted reference voltage is less than a predetermined amount.

4. The apparatus as recited in claim 2, wherein the calibration circuit is configured to update the lookup table responsive to selecting the first reference voltage as an operating voltage in the first performance state.

5. The apparatus as recited in claim 2, wherein the calibration circuitry is configured to perform the first calibration at the first reference voltage by varying a delay applied to a data strobe signal while conducting reads of data using the first reference voltage to distinguish between logic 0's and logic 1's, and wherein the calibration circuit is further configured to perform the second calibration at the second reference voltage by varying the delay applied to a data strobe signal while conducting reads of data using the second reference voltage to distinguish between logic 0's and logic 1's.

6. The apparatus as recited in claim 1, wherein the calibration circuitry is configured to select the first operating voltage upon resuming operation in the first performance state responsive to detecting an error in the lookup table when obtaining the predicted reference voltage.

7. The apparatus as recited in claim 1, wherein an initial version of the lookup table is based on vendor-provided information.

8. The apparatus as recited in claim 1, wherein the memory controller is configured to load a version of the lookup table into storage circuitry during an initial system boot.

9. A method comprising:
operating a memory subsystem in a first performance state, the memory subsystem including a memory controller coupled to a memory, wherein operating in the first performance state comprises operating the memory subsystem using a first reference voltage value;
operating the memory subsystem in a second performance state, wherein operating the memory subsystem in a second performance state comprises using a second reference voltage different than the first reference voltage, wherein each of the first and second reference voltages are used to distinguish logic 0's from logic 1's; and
resuming operation of the memory subsystem in the first performance state, wherein resuming operation in the first performance state comprises obtaining a predicted reference voltage value from a lookup table and set an operating reference voltage to one of the first reference voltage and the predicted reference voltage based on calibration results.

10. The method as recited in claim 9, further comprising loading the lookup table into a storage circuit of the memory controller during a system boot procedure.

11. The method as recited in claim 9, wherein resuming operation in the first performance state comprises:

performing, using calibration circuitry in the memory controller, a first calibration of the memory subsystem at the first reference voltage;
performing a second calibration of the memory subsystem at the predicted reference voltage; and
selecting one of the first reference voltage and the predicted reference voltage as an operating reference voltage based on which of the first and second calibrations resulted in a largest data eye.

12. The method as recited in claim 11, further comprising the calibration circuitry canceling the second calibration responsive to determining that a difference between the first reference voltage and the predicted reference voltage is less than a threshold value.

13. The method as recited in claim 11, further comprising the calibration circuitry updating the lookup table responsive to selecting the first reference voltage as an operating voltage in the first performance state.

14. The method as recited in claim 11, wherein performing the first calibration at the first reference voltage comprises varying a delay applied to a data strobe signal while conducting reads of data using the first reference voltage to distinguish between logic 0's and logic 1's, and wherein performing the second calibration at the predicted reference voltage comprises varying the delay applied to a data strobe signal while conducting reads of data using the predicted reference voltage to distinguish between logic 0's and logic 1's.

15. The method as recited in claim 9, further comprising error correction circuitry checking for errors in the lookup table by applying error correction codes (ECCs) to information read from the lookup table, and further comprising selecting the first reference voltage upon resuming operation in the first performance state responsive to detecting an error in the lookup table when obtaining the predicted reference voltage.

16. A system comprising:
A memory subsystem including a memory controller and a memory, wherein the memory controller includes a lookup table comprising a plurality of different reference voltage values, each of the reference voltage values corresponding to a unique one of a plurality of different performance states;
wherein the memory controller includes calibration circuitry configured to:
determine a first reference voltage during operation in a first performance state;
upon resuming operation in the first performance state subsequent to operating the memory subsystem in another performance state, perform first and second calibrations of the memory subsystem, wherein performing the first calibration comprises calibrating the memory subsystem at the first reference voltage, and wherein performing the second calibration comprises calibrating the memory subsystem at a predicted reference voltage obtained from the lookup table; and
select one of the first reference voltage and the predicted reference voltage as an operating reference voltage based on which of the first and second calibrations resulted in a largest data eye.

17. The system as recited in claim 16, wherein the calibration circuitry is further configured to cancel the second calibration if a difference between the first reference voltage and the predicted reference voltage is less than a threshold value.

18. The system as recited in claim 16, wherein the calibration circuitry is further configured to update the lookup table with the first reference voltage responsive to selecting the first reference voltage as the operating reference voltage.

* * * * *